US011764798B2

(12) United States Patent
Huang

(10) Patent No.: US 11,764,798 B2
(45) Date of Patent: Sep. 19, 2023

(54) PIPELINE ANALOG TO DIGITAL CONVERTER AND SIGNAL CONVERSION METHOD

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 15 days.

(21) Appl. No.: 17/688,942

(22) Filed: Mar. 8, 2022

(65) Prior Publication Data
US 2022/0376696 A1 Nov. 24, 2022

(30) Foreign Application Priority Data
May 24, 2021 (TW) ................... 110118688

(51) Int. Cl.
*H03M 1/10* (2006.01)
*H03M 1/12* (2006.01)
(52) U.S. Cl.
CPC ......... *H03M 1/1019* (2013.01); *H03M 1/123* (2013.01)
(58) Field of Classification Search
CPC ....... H03M 1/12; H03M 1/123; H03M 1/1019
USPC .......... 341/144, 155, 161, 120, 118
See application file for complete search history.

(56) References Cited

U.S. PATENT DOCUMENTS

| 5,184,127 A * | 2/1993 | Myers ................. H03M 1/1023 341/122 |
| 7,574,309 B2 * | 8/2009 | Strittmatter ............ G09G 3/006 702/57 |
| 10,033,395 B1 * | 7/2018 | Vaz ....................... H03M 1/001 |

OTHER PUBLICATIONS

S. Hashemi and B. Razavi, "Analysis of Metastability in Pipelined ADCs," in IEEE Journal of Solid-State Circuits, vol. 49, No. 5, pp. 1198-1209, May 2014, doi: 10.1109/JSSC.2014.2305075.
(Continued)

*Primary Examiner* — Peguy Jean Pierre
(74) *Attorney, Agent, or Firm* — WPAT, P.C

(57) ABSTRACT

A pipeline analog to digital converter includes converter circuitries and a calibration circuitry. The converter circuitries sequentially convert an input signal into a plurality of first digital codes, in which a first converter circuitry in the converter circuitries is configured to perform a quantization according to a first signal to generate a first corresponding digital code in the first digital codes, and the first signal is a signal, which is processed by the first converter circuitry, of the input signal and a previous stage residue signal. The calibration circuitry combines the first digital codes to output a second digital code, detects whether the quantization is completed to generate control signals, and determines whether to set the second digital code to be a second corresponding digital code in predetermined digital codes according to the control signals.

15 Claims, 6 Drawing Sheets

(56) References Cited

OTHER PUBLICATIONS

P. M. Figueiredo, "Comparator Metastability in the Presence of Noise," in IEEE Transactions on Circuits and Systems I. Regular Papers, vol. 60, No. 5, pp. 1286-1299, May 2013, doi: 10.1109/TCSI.2012.2221195.

S.-H. Cho, C.-K. Lee, S.-G. Lee and S.-T. Ryu, "A Two-Channel Asynchronous SAR ADC With Metastable-Then-Set Algorithm," in IEEE Transactions on Very Large Scale Integration (VLSI) Systems, vol. 20, No. 4, pp. 765-769, Apr. 2012, doi: 10.1109/TVLSI.2011.2109743.

* cited by examiner

PIPELINE ANALOG TO DIGITAL CONVERTER AND SIGNAL CONVERSION METHOD

BACKGROUND OF THE INVENTION

1. Field of the Invention

The present disclosure relates to a pipeline analog to digital converter, especially to a pipeline analog to digital converter able to set predetermined digital codes and a signal conversion method thereof.

2. Description of Related Art

A pipeline analog to digital converter can sequentially convert input signals into corresponding digital codes through multi-stage conversion. In the current approaches, the operation period of each stage of conversion is fixed. As the clock speed increases, the time of a cycle shortens. As a result, comparator circuit(s) in the pipeline analog-to-digital converter may not be able to generate correct quantization results within a predetermined time, which results in an inaccurate final output digital code.

SUMMARY OF THE INVENTION

In some aspects of the present disclosure, a pipeline analog to digital converter includes a plurality of converter circuitries and a calibration circuitry. The plurality of converter circuitries are configured to sequentially convert an input signal into a plurality of first digital codes, in which a first converter circuitry in the plurality of converter circuitries is configured to perform a quantization according to a first signal to generate a first corresponding digital code in the plurality of first digital codes, and the first signal is a signal, which is processed by the first converter circuitry, of the input signal and a previous stage residue signal. The calibration circuitry is configured to combine the plurality of first digital codes to output a second digital code, detect whether the quantization is completed to generate a plurality of control signals, and determine whether to set the second digital code to be a second corresponding digital code in a plurality of predetermined digital codes according to the plurality of control signals.

In some aspects of the present disclosure, a signal conversion method includes the following operations: sequentially converting, by a plurality of converter circuitries, an input signal into a plurality of first digital codes, wherein a first converter circuitry in the plurality of converter circuitries is configured to perform a quantization according to a first signal to generate a first corresponding digital code in the plurality of first digital codes, and the first signal is a signal, which is processed by the first converter circuitry, of the input signal and a previous stage residue signal; combining the plurality of first digital codes to output a second digital code; and detecting whether the quantization is completed to generate a plurality of control signals, and determining whether to set the second digital code to be a second corresponding digital code in a plurality of predetermined digital codes according to the plurality of control signals.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
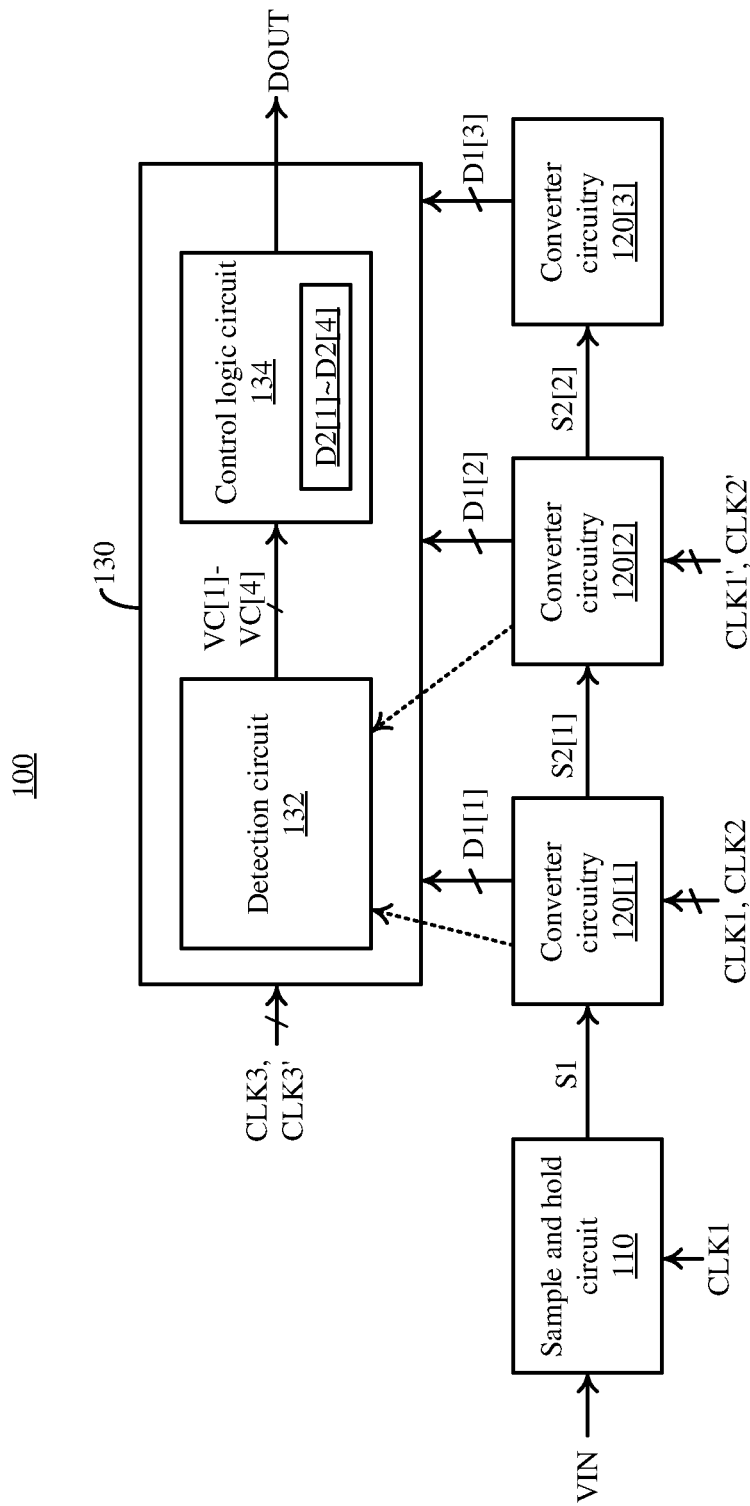
FIG. 1 is a schematic diagram of a pipeline analog to digital converter according to some embodiments of the present disclosure.

FIG. 1 is a schematic diagram of a pipeline analog to digital converter 100 according to some embodiments of the present disclosure. The pipeline analog to digital converter 100 includes a sample and hold circuit 110, converter circuitries 120[1]-120[3], and calibration circuitry 130.

The sample and hold circuit 110 samples an input signal VIN according to a clock signal CLK1, and outputs the sampled input signal VIN to be a signal S1. In some embodiments, the sample and hold circuit 110 may be implemented with a switched capacitor circuit. The converter circuitries 120[1]-120[3] sequentially convert the sampled input signal VIN (i.e., the signal S1) from the sample and hold circuit 110 to into digital codes D1[1]-D1[3]. In some embodiments, the converter circuitries 120[1]-120[2] have the same circuit architecture. In some embodiments, the converter circuitry 120[3] may be, but not limited to, a flash analog to digital converter circuit, which is configured to generate the digital code D1[3] according to a residue signal S2[2] generated from the converter circuitry 120[2].

The calibration circuitry 130 detects whether a quantization of the converter circuitry 120[1] is completed to generate control signals VC[1] and VC[2], and detects whether a quantization of the converter circuitry 120[2] is completed to generate control signals VC[3] and VC[4]. The calibration circuitry 130 further combines the digital codes D1[1]-D1[3] to output a digital code DOUT, and determines whether to set the digital code DOUT to be a corresponding one of predetermined digital codes D2[1]-D2[4] according to the control signals VC[1]-VC[4].

In some embodiments, the calibration circuitry 130 is further configured to run a test on the converter circuitries 120[1]-120[3] during a testing phase, in order to generate the predetermined digital codes D2[1]-D2[4]. Operations regarding herein will be provided with reference to FIG. 3.

In some embodiments, the calibration circuitry 130 includes a detection circuit 132 and a control logic circuit 134. The detection circuit 132 is configured to detect whether the quantization of the converter circuitry 120[1] and that of the converter circuitry 120[2] are completed, in order to generate the control signals VC[1]-VC[4]. The control logic circuit 134 may combine the digital codes D1[1]-D1[3] to be the digital code DOUT. The control logic circuit 134 determines whether to set the digital code DOUT to be a corresponding one of predetermined digital codes D2[1]-D2[4] according to the control signals VC[1]-VC[4].

For example, if the detection circuit 132 detects that a quantization of a comparator circuit (e.g., a comparator circuit 201 in FIG. 2B) in the converter circuitry 120[1] has not been completed, the detection circuit 132 may output the control signal VC[1] having a first logic value (e.g., a logic value of 1). In response to the control signal VC[1], the control logic circuit 134 may set the digital code DOUT to be the predetermined digital code D2[1]. If the detection circuit 132 detects that a quantization of another comparator circuit (e.g., a comparator circuit 202 in FIG. 2B) in the converter circuitry 120[1] has not been completed, the detection circuit 132 may output the control signal VC[2] having the first logic value. In response to the control signal VC[2], the control logic circuit 134 may set the digital code DOUT to be the predetermined digital code D2[2]. If a corresponding one of the control signal VC[1] or the control signal VC[2] has a second logic value (e.g., a logic value of 0), the control logic circuit 134 does not set the digital code DOUT to be a corresponding one of the predetermined digital code D2[1] or the predetermined digital code D2[2]. With this analogy, the corresponding relation between the control signals VC[3]-VC[4] and the predetermined digital codes D2[3]-D2[4] can be understood. In some embodiments, the control logic circuit 134 may be implemented with digital circuits and at least one register circuit, in which the at least one register circuit may be configured to store the predetermined digital codes D2[1]-D2[4].

Figure 2A:
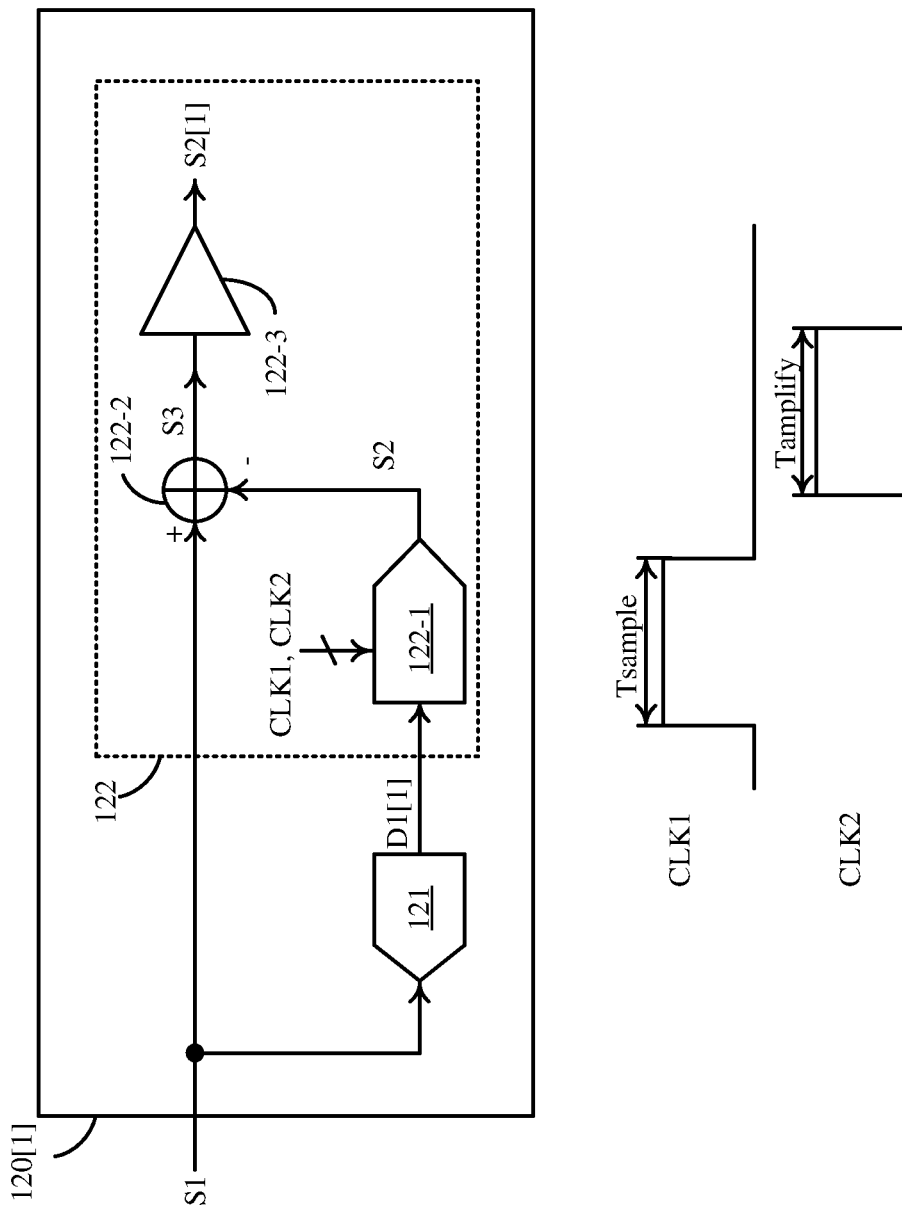
FIG. 2A is a schematic diagram of the converter circuitry in FIG. 1 according to some embodiments of the present disclosure.

FIG. 2A is a schematic diagram of the converter circuitry 120[1] in FIG. 1 according to some embodiments of the present disclosure. The converter circuitry 120[1] includes a sub-analog to digital converter circuit 121 and a multiplying digital to analog converter (MDAC) circuit (hereinafter referred to as "the MDAC circuit 122"). During a sampling phase Tsample of the clock signal CLK1, the sub-analog to digital converter circuit 121 performs the quantization according to the signal S1, in order to generate the digital code D1[1]. The MDAC circuit 122 processes the digital code D1[1] and the signal S1 according to the clock signal CLK2, in order to generate a current stage residue signal S2[1]. For example, in response to a rising edge of the clock signal CLK2, the MDAC circuit 122 may start processing the digital code D1[1] and the signal S1, and generate the current stage residue signal S2[1] in an amplification phase Tamplify of the clock signal CLK2.

In some embodiments, the MDAC circuit 122 includes a sub-digital to analog converter circuit 122-1, a subtractor circuit 122-2, and a residue amplifier circuit 122-3. In response to the clock signal CLK2, the sub-digital to analog converter circuit 122-1 may convert the digital code D1[1] into a signal S2. The subtractor circuit 122-2 subtracts the signal S2 from the signal S1, in order to generate a signal S3. The residue amplifier circuit 122-3 may amplify the signal S3 to output the current stage residue signal S2[1]. In some embodiments, the sub-digital to analog converter circuit 122-1, the subtractor circuit 122-2, and the residue amplifier circuit 122-3 may be implemented with a switched-capacitor circuit (not shown in FIG. 2A). Some switches in the switched-capacitor circuit are turned on during the sampling phase Tsample of the clock signal CLK1, in order to store the signal S1. Other switches in the switched-capacitor circuit are turned on during the amplification phase Tamplify of the clock signal CLK2, in order to perform related operations of the MDAC circuit 122.

Figure 2B:
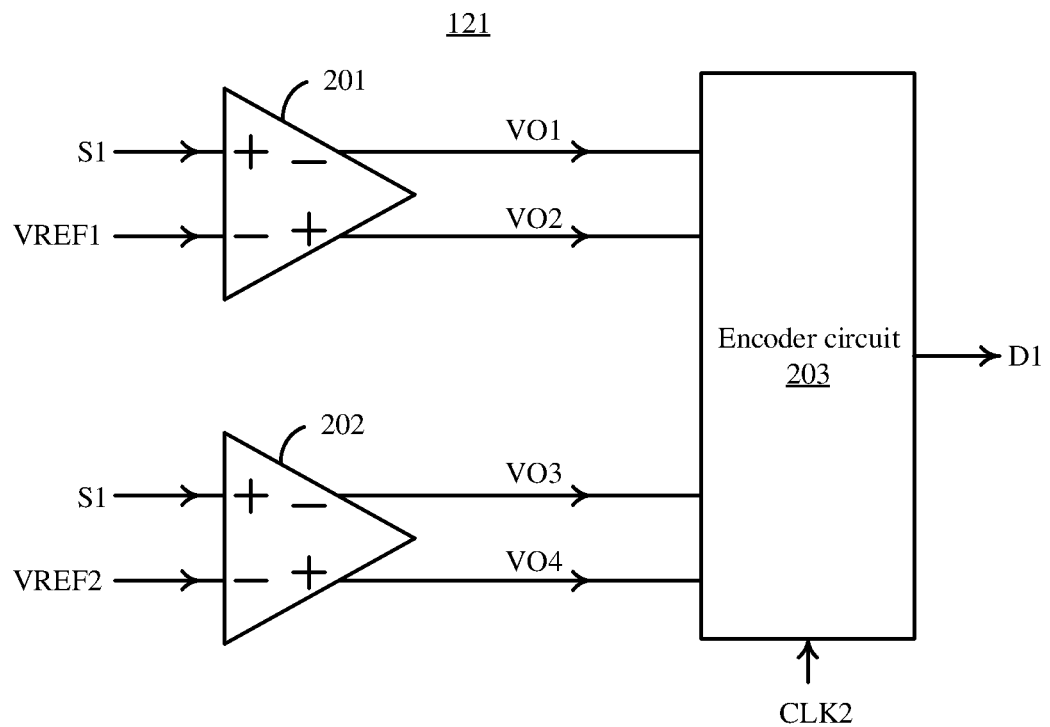
FIG. 2B is a schematic diagram of the sub-analog to digital converter circuit in FIG. 2A according to some embodiments of the present disclosure.

FIG. 2B is a schematic diagram of the sub-analog to digital converter circuit 121 in FIG. 2A according to some embodiments of the present disclosure. In some embodiments, the sub-analog to digital converter circuit 121 includes a comparator circuit 201, a comparator circuit 202, and an encoder circuit 203. The comparator circuit 201 and the comparator circuit 202 compare the signal S1 with a reference voltage VREF1 and a reference voltage VREF2, respectively (i.e., the aforementioned quantization), in order to generate output signals VO1-VO4. The encoder circuit 203 is configured to encode the output signals VO1-VO4 according to the clock signal CLK2, in order to output the corresponding digital code D1[1]. In some embodiments, the encoder circuit 203 may include logic gate circuits (which may be, but not limited to, AND gate circuits), which may output the digital code D1[1] when the clock signal CLK2 is at a high level.

In greater detail, the comparator circuit 201 compares the signal S1 with the reference voltage VREF1, in order to generate the output signal VO1 and the output signal VO2. In some embodiments, the comparator circuit 201 is a differential comparator circuit. In an initial state, two output terminals of the differential comparator circuit are reset to have a predetermined level, such that the output signal VO1 and the output signal VO2 are at the predetermined level. For example, the predetermined level is a high level, and the output signal VO1 and the output signal VO2 have logic values of 1 at the initial state. Alternatively, in some other examples, the predetermined level is a low level, and the output signal VO1 and the output signal VO2 have logic values of 0 at the initial sate. After a comparison between the signal S1 and the reference voltage VREF1 is completed, one output terminal of the comparator circuit 201 is at the high level, and another one output terminal of the comparator circuit 201 is at the low level. In other words, when the quantization is completed, one of the output signal VO1 and the output signal VO2 has the logic value of 1, and another one of those signals has the logic value of 0. Therefore, the detection circuit 132 may determine whether the quantization of the comparator circuit 201 is completed according to logic values of the output signals VO1-VO2, and may determine whether the quantization of the comparator circuit 202 is completed according to logic values of the output signals VO3-VO4. Related operations of the comparator circuit 202 can be understood with reference to those of the comparator circuit 201, and thus the repetitious descriptions are not further given. In some embodiments, the reference voltage VREF1 may be, but not limited to, −0.25 times a reference voltage VREF, and the reference voltage VREF2 may be, but not limited to, 0.25 times the reference voltage VREF.

Figure 2C:
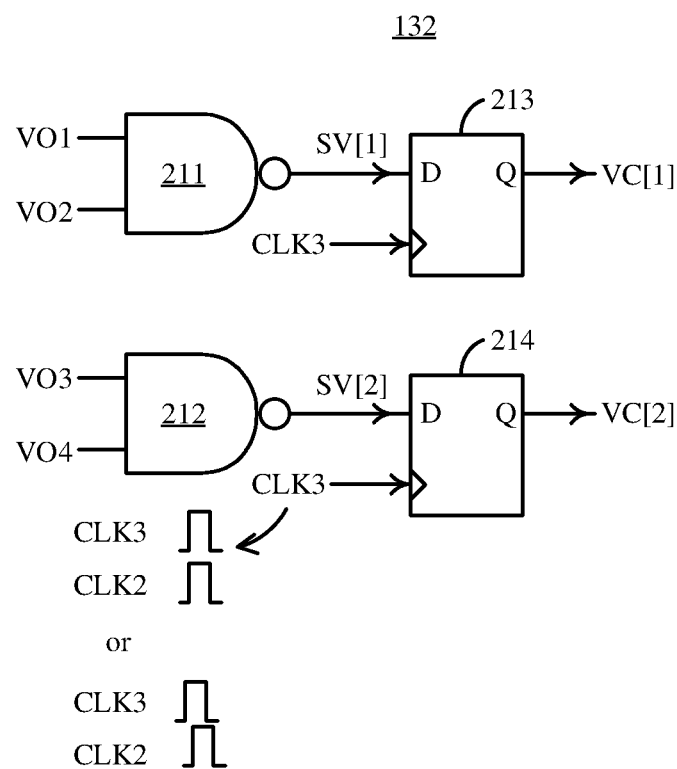
FIG. 2C is a schematic diagram of the detection circuit in FIG. 1 according to some embodiments of the present disclosure.

FIG. 2C is a schematic diagram of the detection circuit 132 in FIG. 1 according to some embodiments of the present disclosure. For ease of understating, FIG. 2C only shows a circuit portion for detecting the quantization of the converter circuitry 120[1]. The detection circuit 132 includes logic gate circuits 211-212 and flip flop circuits 213-214. As mentioned above, in some examples of FIG. 2B, the output signal VO1 and the output signal VO2 have logic values of 1 at the initial state. After the quantization is completed, one of the output signal VO1 and the output signal VO2 has the logic value of 1, and another one of those signals has the logic value 0. Under this condition, each of the logic gate circuits 211-212 may be implemented with a NAND gate circuit. The logic gate circuits 211-212 generate valid signals SV[1]-SV[2] according to the output signals VO1-VO4. For example, the logic gate circuit 211 generates the valid signal SV[1] according to the output signals VO1-VO2. If the output signal VO1 and the output signal VO2 both have the logic values of 1, the logic gate circuit 211 may output the valid signal SV[1] having the logic value of 0, in order to indicate that the quantization has not been completed. If each one of the output signal VO1 and the output signal VO2 has the logic value of 1 and another one of the output signal VO1 and the output signal VO2 has the logic value of 0, the logic gate circuit 211 may output the valid signal SV[1] having the logic value of 1, in order to indicate that the quantization is completed. Similarly, the logic gate circuit 212 may generate the valid signal SV[2] according to the output signals VO3-VO4.

The flip flop circuits 213-214 respectively receive the valid signals SV[1]-SV[2] according to the clock signal CLK3, in order to generate the control signals VC[1]-VC[2]. In some embodiments, each of the flip flop circuits 213-214 may be a D flip-flop circuit. In some embodiments, the clock signal CLK3 may be identical to the clock signal CLK2. In some embodiments, the clock signal CLK3 and the clock signal CLK2 have identical initial timings, or a phase of the clock signal CLK3 leads to a phase of the clock signal CLK2. In response to a rising edge of the clock signal CLK3, the flip flop circuits 213-214 output the valid signals SV[1]-SV[2] to be the control signals VC[1]-VC[2]. If the control signal VC[1] has the logic value of 1, it indicates that the quantization of the comparator circuit 201 is completed. If the control signal VC[1] has the logic value of 0, it indicates that the quantization of the comparator circuit 201 has not been completed. If the control signal VC[2] has the logic value of 1, it indicates that the quantization of the comparator circuit 202 is completed. If the control signal VC[2] has the logic value of 0, it indicates that the quantization of the comparator circuit 202 has not been completed.

The above arrangements of the detection circuit 132 are given for illustrative purposes, and the present disclosure is not limited thereto. For example, in some other examples, the output signal VO1 and the output signal VO2 have the logic values of 0 at the initial state. After the quantization is completed, one of the output signal VO1 and the output signal VO2 has the logic value of 1, and another one of those signals has the logic value of 0. Under this condition, each of the logic gate circuits 211-212 may be implemented with a NOR gate circuit.

Circuit architecture of the converter circuitry 120[2] is the same as that of the converter circuitry 120[1]. As shown in FIG. 1, operations of the converter circuitry 120[2] are performed according to a clock signal CLK1' and a clock signal CLK2'. Similar to the clock signal CLK1 and the clock signal CLK2 in FIG. 2A, the clock signal CLK1' has the sampling phase Tsample, the clock signal CLK2' has the amplification phase Tamplify, and the amplification phase Tamplify of the clock signal CLK2' follows the sampling phase Tsample of the clock signal CLK1'. In some embodiments, the sampling phase Tsample of the clock signal CLK1' may be partially overlapped with the amplification phase of the clock signal CLK2, or the sampling phase Tsample of the clock signal CLK1' may be partially overlapped with the amplification phase of the clock signal CLK2. Similarly, the detection circuit 132 may further include another two logic gate circuits and another two flip flop circuits, in order to detect the quantization of the converter circuitry 120[2]. The another two logic gate circuits receive output signals from the converter circuitry 120[2], and the another two flip flop circuits output the control signals VC[3] and VC[4] according to another clock signal (e.g., the clock signal CLK3' in FIG. 1), in which configurations between the clock signal CLK3' and the clock signal CLK2' are similar to those between the clock signal CLK3 and the clock signal CLK2 in FIG. 2C. The operations and arrangements of the converter circuitry 120[2] and the detection circuit 132 can be understood with reference to FIG. 2B and FIG. 2C, and thus the repetitious descriptions are not further given.

Figure 2D:
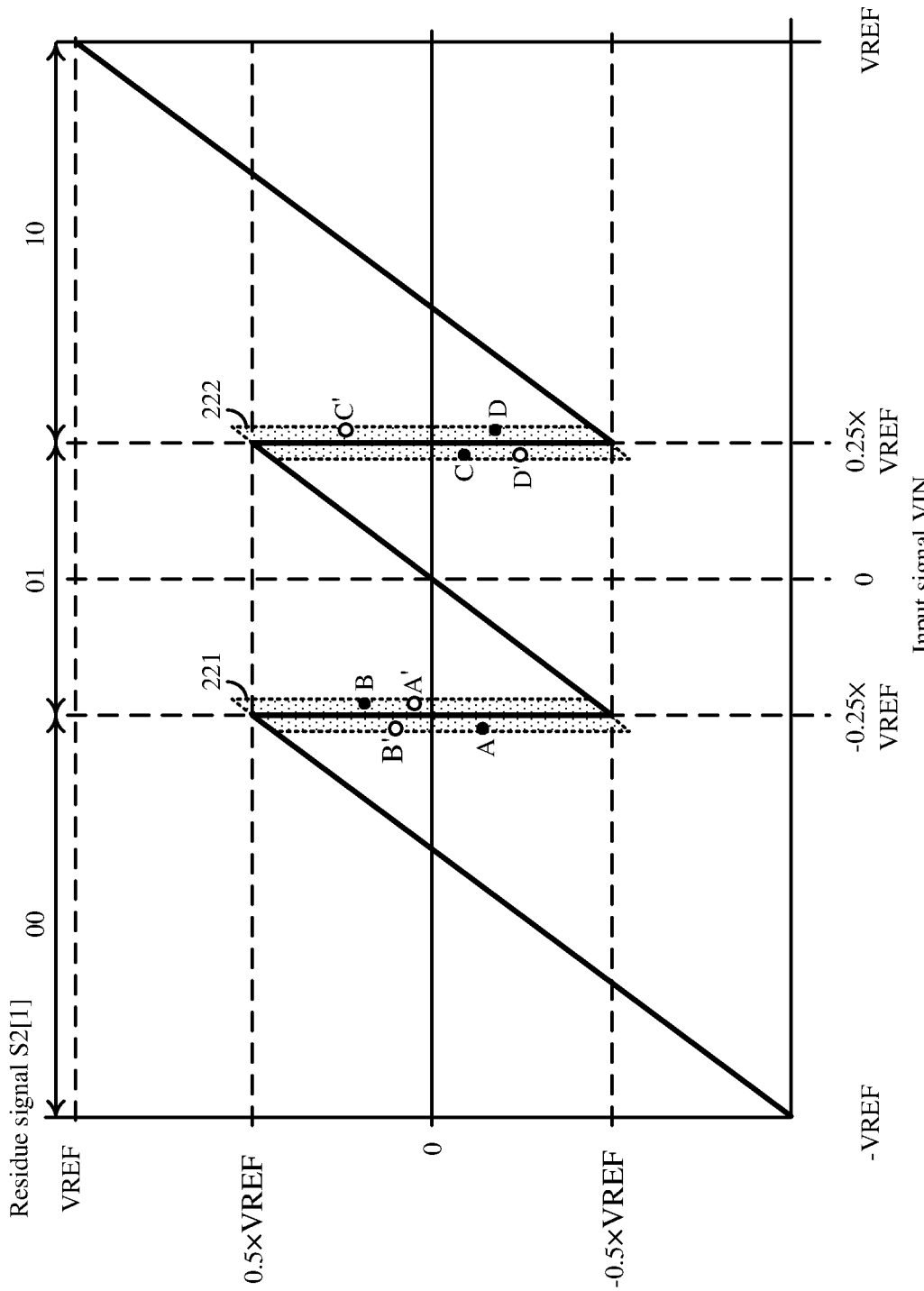
FIG. 2D is a schematic diagram illustrating conversion characteristic of the input signal and the residue signal in FIG. 1 according to some embodiments of the present disclosure.

FIG. 2D is a schematic diagram illustrating conversion characteristic of the input signal VIN and the residue signal S2[1] in FIG. 1 according to some embodiments of the present disclosure. In FIG. 2D, the horizontal axis indicates the input signal VIN (i.e., the signal S1) inputted to the converter circuitry 120[1], and the vertical axis indicates the current stage residue signal S2[1] inputted to the converter circuitry 120[2]. In examples of FIG. 2B, the sub-analog to digital converter circuit 121 is equivalent to a 1.5 bit analog to digital converter, which may provide the digital code D1[1] (or D1[2]) corresponding to a region in which an analog signal (e.g., the signal S1 or the residue signal S2[1]) falls. For example, if the input signal VIN is less than −0.25 times reference voltage VREF (i.e., the reference voltage VREF1), the digital code D1[1] is 00 (which corresponds to the value of −1). If the input signal VIN is at between −0.25 times reference voltage VREF and 0.25 times reference voltage VREF (i.e., the reference voltage VREF2), the digital code D1[1] is 01 (which corresponds to the value of 0). If the input signal VIN is greater than 0.25 times the reference voltage VREF, the digital code D1[1] is 10 (which corresponds to the value of 1).

In order to enable the residue signal S2[1] to conform to an input range of a next stage converter circuitry (e.g., the converter circuitry 120[2]), the MDAC circuit 122 may perform a corresponding process (e.g., the equation listed as follows) on the input signal VIN according to the current digital code D1[1] and the input signal VIN). As a result, it can ensure that the converter circuitry 120[2] is able to sequentially and correctly process the input signal VIN.

$$S2[1]=2\times V_{IN}-VREF, \text{ if } V_{IN}>0.25\times VREF$$

$$S2[1]=2\times V_{IN}, \text{ if } -0.25\times VREF<V_{IN}<0.25\times VREF$$

$$S2[1]=2\times V_{IN}+VREF, \text{ if } V_{IN}<-0.25\times VREF$$

According to the above equitation, if the sub-analog to digital converter circuit 121 determines that the input signal VIN is lower than −0.25 times the reference voltage VREF, the MDAC circuit 122 shifts up the input signal VIN, in order to output the current stage residue signal S2[1]. As a result, the subsequent converter circuitry (e.g., the converter circuitry 120[2] and the converter circuitry 120[3]) will output the digital codes D1[2]-D1[3] having higher values according to the current stage residue signal S2. Alternatively, if the sub-analog to digital converter circuit 121 determines that the input signal VIN is between −0.25 times the reference voltage VREF and 0.25 times the reference voltage, the MDAC circuit 122 does not shift the input signal VIN, in order to output current stage residue signal S2[1]. As a result, compared with the digital codes D1[2] and D1[3] in the above condition, the subsequent convert circuitries will output the digital codes D1[2] and D1[3] having lower values according to the current stage residue signal S2[1]. If the sub-analog to digital converter circuit 121 determines that the input signal VIN is higher than 0.25 times the reference voltage VREF, the MDAC circuit 122 shifts down the input signal VIN, in order to output the current stage signal S2[1]. As a result, compared with the digital code D1[2] and D1[3] in the previous two conditions, the subsequent converter circuitries will output the digital code D1[2] and D1[3] having lowest values according to the current stage residue signal S2[1].

Taking two regions corresponding two successive digital codes 00 and 01 as an example, if the input signal VIN (e.g., a signal at the location of point A) is lower than but significantly close to −0.25 times the reference voltage VREF, ideally, the comparator circuit 201 may determine that the input signal VIN is lower than −0.25 times the reference voltage VREF. However, because of impacts from noises and/or a voltage difference (e.g., the difference between the input signal VIN and the reference voltage VREF1; labeled as a region 221) being too small, the comparator circuit 201 may take a longer time to complete the quantization. If the quantization cannot be completed during the predetermined amplification phase Tamplify, the comparator circuit 201 may determine that the input signal VIN (e.g., misjudged to be a signal at the location of point A') is between −0.25 times the reference voltage VREF and 0.25 times the reference voltage VREF by mistake. Under this condition, the MDAC circuit 122 will not shift up the input signal VIN (corresponding to the location of point A'), and the subsequent converter circuitry 120[2] and the converter circuitry 120[3] will output the digital codes D1[2]-D1[3] having relatively lower values. As a result, the digital output DOUT will be inaccurate.

Alternatively, if the input signal VIN (e.g., a signal at the location of point B) is higher than and significantly close to −0.25 times the reference voltage VREF, ideally, the comparator circuit 201 may determine that the input signal VIN is between −0.25 times the reference voltage VREF and 0.25 times the reference voltage VREF. However, because impacts from noises and/or the voltage difference being too small, the comparator circuit 201 may determine that the input signal VIN (e.g. misjudged to be a signal at the location of point B') is lower than −0.25 times the reference voltage VREF by mistake. Under this condition, the MDAC circuit 122 will shift up the input signal VIN (corresponding to the location of point B'), and the subsequent converter circuitry 120[2] and the converter circuitry 120[3] will output the digital codes D1[2]-D1[3] having higher values. As a result, the digital code DOUT will be inaccurate.

Similarly, taking two regions corresponding to two successive digital codes 01 and 10 as example, if the input signal VIN (e.g., a signal at the location of point C) is significantly close to but lower than 0.25 times the reference voltage VREF, ideally, the comparator circuit 202 may determine that the input signal VIN is lower than 0.25 times the reference voltage VREF. However, because of impacts from noises and/or the voltage difference (e.g., a difference between the input signal VIN and the reference voltage VREF2; labeled as an interval 222) being too small, the comparator circuit 202 may take a longer time to complete the quantization. If the quantization cannot be completed during the predetermined amplification phase Tamplify, the comparator circuit 202 may determine the input signal VIN (e.g., misjudged to be a signal at the location of C") is higher than 0.25 times the reference voltage VREF by mistake. Under this condition, the MDAC circuit 122 shifts down the input signal VIN (corresponding to the location of point C"), and the subsequent converter circuitry 120[2] and the converter circuitry 120[3] will output the digital codes D1[2]-D1[3] having lower values. As a result, the digital code DOUT will be inaccurate.

Alternatively, if the input signal VIN (e.g., a signal at the location of point D) is higher than but significantly close to 0.25 times the reference voltage VREF, ideally, the comparator circuit 202 may determine that the input signal VIN is higher than 0.25 times the reference voltage VREF. However, because of impacts from noises and/or the voltage difference being too small, the comparator circuit 202 may determine that the input signal VIN (e.g., misjudged to be a signal at the location of point D') is between −0.25 times the reference voltage VREF and 0.25 times the reference voltage VREF. Under this condition, the MDAC circuit 122 does not shift the input signal VIN (corresponding to the location of point D', and the subsequent converter circuitry 120[2] and the converter circuitry 120[3] will output the digital codes D1[2]-D1[3] having a higher value. As a result, the digital code DOUT will be inaccurate. In some embodiments, the above misjudgments can be corrected with operations in FIG. 3 performed by the calibration circuitry 130.

Figure 3:
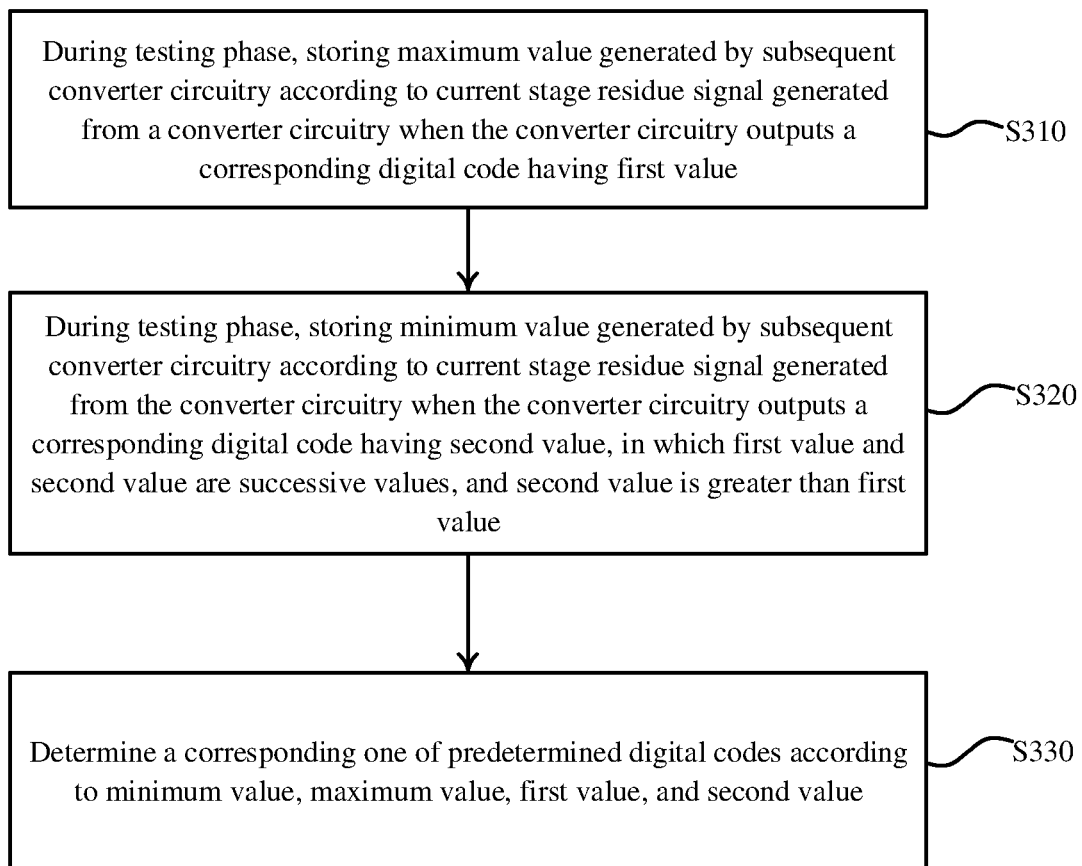
FIG. 3 is a flowchart of operations of the calibration circuitry according to some embodiments of the present disclosure.

FIG. 3 is a flowchart of operations of the calibration circuitry 130 according to some embodiments of the present disclosure. In some embodiments, operations in FIG. 3 may be performed by the control logic circuit 134 of the calibration circuitry 130. In operation S310, during a testing phase, a maximum value generated by a subsequent converter circuitry (e.g., the converter circuitries 120[2]-120[3] subsequent coupled to the converter circuitry 120[1]) according to a current stage residue signal generated from a converter circuitry when the converter circuitry (e.g., the converter circuitry 120[1]) outputs a corresponding digital code having a first value is stored. For example, when the converter circuitry 120[1] outputs the digital code D1[1] having the value of −1, the control logic circuit 134 may record and store the maximum value which is generated from the converter circuitry 120[2] and the converter circuitry 120[3] according to the residue signal S2[1]. As mentioned above, the above maximum value may be a signal generated on condition that the signal S1 having the value of 0 is misjudged to be the digital code D1[1] having the value of −1 (e.g., the signal at the location of B is misjudged to be the signal at the location of point B'). Alternatively, when the converter circuitry 120[2] outputs the digital code D1[2] having the value of −1, the control logic circuit 134 may record and store a maximum value that is generated from the converter circuitry 120[3] according to the residue signal S2[2].

In operation S320, during the testing phase, a minimum value generated by the subsequent converter circuitry according to the current stage residue signal generated from the converter circuitry when the converter circuitry outputs a corresponding digital code having a second value is stored, in which the first value and the second value are successive values, and the second value is greater than the first value. For example, when the converter circuitry 120[1] outputs the digital code D1[1] having the value of 0, the control logic circuit 134 may record and store the minimum vale generated from the converter circuitry 120[2] and the converter circuitry 120[3] according to the residue signal S2[1]. As mentioned above, the above minimum value may be a signal generated on condition that the signal S1 having the value of −1 is misjudged as the digital code D1[1] having the value of 0 (e.g., the signal at the location of point A is misjudged as the signal at the location of point A'). Alternatively, when the converter circuitry 120[2] outputs the digital code D1[2] having the value of 0, the control logic circuit 134 may record and store the minimum value that is generated by the converter circuitry 120[3] according to the residue signal S2[2].

In operation S330, a corresponding one of the predetermined digital codes is determined according to the minimum value, the maximum value, the first value, and the second value. In some embodiments, after the maximum value and the minimum value corresponding to all comparators in the converter circuitry 120[1] and the converter circuitry 120[2] are stored, a corresponding one of the predetermined digital code D2[1]-D2[4] can be determined. Taking the comparator circuit 201 in FIG. 2B as an example, the predetermined digital code D2[1] may be expressed as follows:

$$D2[1] = \frac{[(N1 \times \omega + X1) + (N2 \times \omega + X2)]}{2}$$

In which N1 is the first value (e.g., −1), N2 is the second value (e.g., 0), X1 is the minimum value, X2 is the maximum value, and w is a weighted value. In some embodiments, ω is a value which is determined by normalizing a digital code (e.g., the digital code D1[1]) from the current converter circuit to all digital codes (e.g., the digital codes D1[2] and D1[3]) from the subsequent converter circuitries.

According to FIG. 2D, it is able to understand that, by utilizing the above calculation after the maximum value and the minimum value are obtained, the location of the predetermined digital code D2[1] is can be at the middle of the region 221. As a result, the predetermined digital code D2[1] that is close to an ideal conversion characteristic can be obtained. Therefore, when the quantization of the comparator circuit 201 is detected to be not completed, the control signal VC[1] has the logic value of 1. In response to the control signal VC[1], the control logic circuit 134 may set the digital code DOUT to be the predetermined digital code D2[1].

By this analogy, with operations S310-S330, the calibration circuitry 130 is able to store the predetermined digital codes D2[1]-D2[4] corresponding to all comparator circuits (e.g., the comparator circuits 201 and 202) in the converter circuitry 120[1] and the converter circuitry 120[2] during the testing phase. As a result, in subsequent operations, the calibration circuitry 130 is able to determine whether to set the digital code DOUT to be a corresponding digital code in the predetermined digital codes D2[1]-D2[4] according to the detection result of quantization.

Figure 4:
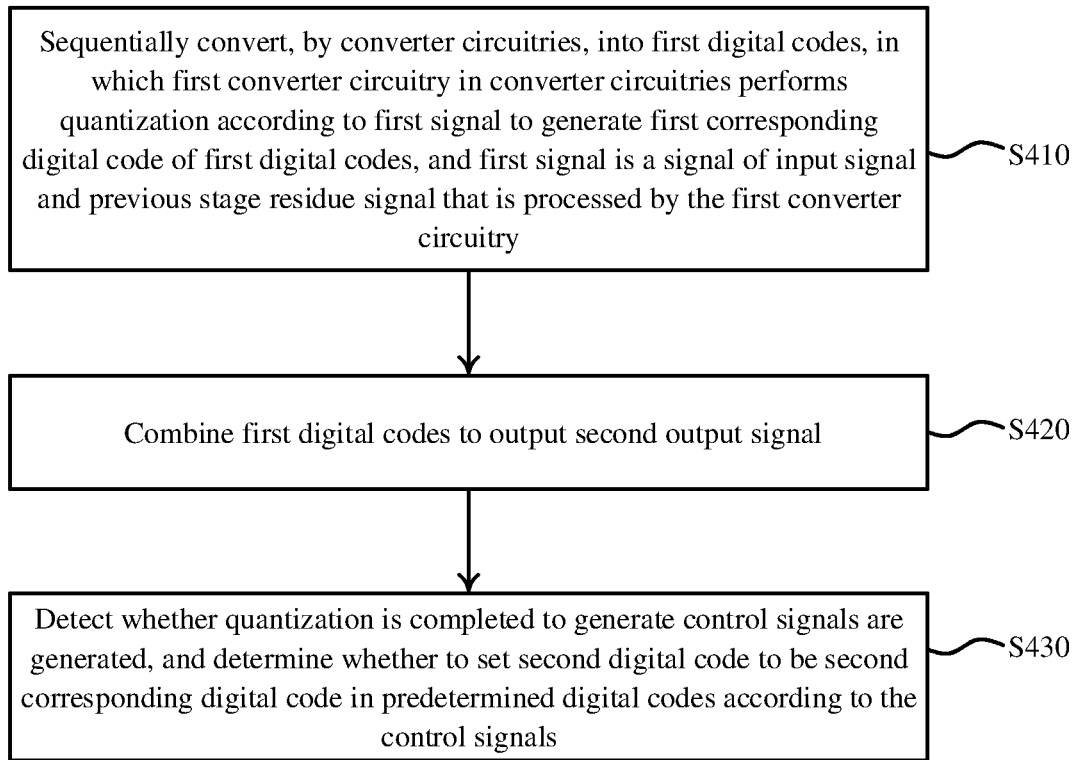
FIG. 4 is a flowchart of a signal conversion method according to some embodiments of the present disclosure.

FIG. 4 is a flowchart of a signal conversion method 400 according to some embodiments of the present disclosure. In operation S410, an input signal is sequentially converted by converter circuitries (e.g., the converter circuitries 120[1]-120[3]) into first digital codes, in which a first converter circuitry in the converter circuitries performs a quantization according to a first signal to generate a first corresponding digital code of the first digital codes, and the first signal is a signal of the input signal and a previous stage residue signal that is processed by the first converter circuitry. For example, if the first converter circuitry is the converter circuitry 120[1], the first signal is the sampled input signal VIN (e.g., the signal S1). Alternatively, if the first converter circuitry is the converter circuitry 120[2], the first signal is the residue signal S2[1] from the converter circuitry 120[1]. In operation S420, the first digital codes are combined to output a second output signal. In operation S430, whether the quantization is completed is detected to generate control signals are generated, and whether to set the second digital code to be a second corresponding digital code in the predetermined digital codes is determined according to the control signals.

Operations S410, S420, and S430 can be understood with reference to the above embodiments, and thus the repetitious descriptions are not further given. The above description of the signal conversion method 400 includes exemplary operations, but the operations of the signal conversion method 400 are not necessarily performed in the order described above. Operations of the signal conversion method 400 can be added, replaced, changed order, and/or eliminated, or the operations of the signal conversion method 400 can be executed simultaneously or partially simultaneously as appropriate, in accordance with the spirit and scope of various embodiments of the present disclosure.

As described above, the pipeline analog to digital converter and the signal conversion method in some embodiments of the present disclosure may detect whether quantization of each stage of converter circuitry is completed, and determine whether to replace the final output digital code to be a predetermined digital code accordingly. As a result, inaccurate digital codes can be prevented from being generated by each stage of converter circuitry.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A pipeline analog to digital converter, comprising:
a plurality of converter circuitries configured to sequentially convert an input signal into a plurality of first digital codes, wherein a first converter circuitry in the plurality of converter circuitries is configured to perform a quantization according to a first signal to generate a first corresponding digital code in the plurality of first digital codes, and the first signal is a signal, which is processed by the first converter circuitry, of the input signal and a previous stage residue signal; and
a calibration circuitry configured to combine the plurality of first digital codes to output a second digital code, detect whether the quantization is completed to generate a plurality of control signals, and determine whether to set the second digital code to be a second corresponding digital code in a plurality of predetermined digital codes according to the plurality of control signals.

2. The pipeline analog to digital converter of claim 1, wherein the first converter circuitry is further configured to process the first signal according to the first corresponding digital code to generate a current stage residue signal, and during a testing phase, the calibration circuitry is further configured to store a maximum value generated by at least one of the plurality of converter circuitries according to the current stage residue signal when the first converter circuitry generates the first corresponding digital code having a first value, and store a minimum value generated by the at least one of the plurality of converter circuitries according to the current stage residue signal when the first converter circuitry generates the first corresponding digital code having a second value, in order to generate a corresponding one of the plurality of predetermined digital codes.

3. The pipeline analog to digital converter of claim 2, wherein the first value and the second value are successive values, and the second value is greater than the first value.

4. The pipeline analog to digital converter of claim 2, wherein the corresponding one of the plurality of predetermined digital codes is determined according to the minimum value, the maximum value, a third value, and a fourth value, the third value is a product of the first value and a weighted value, and the fourth value is a product of the second value and the weighted value.

5. The pipeline analog to digital converter of claim 1, wherein the calibration circuitry comprises:
a detection circuit configured to detect whether the quantization is completed, in order to generate the plurality of control signals; and
a control logic circuit configured to combine the plurality of first digital codes to generate the second digital code, and determine whether to set the second digital code to the second corresponding digital code according to the plurality of control signals.

6. The pipeline analog to digital converter of claim 5, wherein the detection circuit comprises:
a plurality of logic gate circuits configured to generate a plurality of valid signals according to the plurality of output signals from the first converter circuitry; and
a plurality of flip flop circuits configured to receive the plurality of valid signals to generate the plurality of control signals.

7. The pipeline analog to digital converter of claim 6, wherein the first converter circuitry comprises:
a multiplying digital to analog converter circuit configured to process the first corresponding digital code according to a first clock signal, in order to generate a current stage residue signal,
wherein the plurality of flip flop circuits are configured to generate the plurality of control signals according to a second clock signal, and the second clock signal is identical to the first clock signal, or a phase of the second clock signal leads to a phase of the first clock signal.

8. The pipeline analog to digital converter of claim 6, wherein the first converter circuitry comprises a sub-analog to digital converter circuit, and the sub-analog to digital converter circuit comprises:
a plurality of comparator circuits configured to compare with a plurality of reference voltages, respectively, in order to generate the plurality of output signals; and
an encoder circuit configured to encode the plurality of output signals to output the first corresponding digital code.

9. The pipeline analog to digital converter of claim 6, wherein each of the plurality of logic gate circuits is a NAND gate circuit.

10. A signal conversion method, comprising:
sequentially converting, by a plurality of converter circuitries, an input signal into a plurality of first digital codes, wherein a first converter circuitry in the plurality of converter circuitries is configured to perform a quantization according to a first signal to generate a first corresponding digital code in the plurality of first digital codes, and the first signal is a signal, which is processed by the first converter circuitry, of the input signal and a previous stage residue signal;
combining the plurality of first digital codes to output a second digital code; and
detecting whether the quantization is completed to generate a plurality of control signals, and determining whether to set the second digital code to be a second corresponding digital code in a plurality of predetermined digital codes according to the plurality of control signals.

11. The signal conversion method of claim 10, wherein the first converter circuitry is further configured to process the first signal according to the first corresponding digital code to generate a current stage residue signal, and the signal conversion method comprises:
during a testing phase, storing a maximum value generated by at least one of the plurality of converter circuitries according to the current stage residue signal when the first converter circuitry generates the first corresponding digital code having a first value;
during the testing phase, storing a minimum value generated by the at least one of the plurality of converter circuitries according to the current stage residue signal when the first converter circuitry generates the first corresponding digital code having a second value; and generating a corresponding one of the plurality of predetermined digital codes according to the first value, the second value, the minimum value, and the maximum value.

12. The signal conversion method of claim 11, wherein the first value and the second value are successive values, and the second value is greater than the first value.

13. The signal conversion method of claim 11, wherein the corresponding one of the plurality of predetermined digital codes is determined according to the minimum value, the maximum value, a third value, and a fourth value, the third value is a product of the first value and a weighted value, and the fourth value is a product of the second value and the weighted value.

14. The signal conversion method of claim 10, wherein detecting the quantization is completed comprises:

generating, by a plurality of logic gate circuits, a plurality of valid signals according to the plurality of output signals from the first converter circuitry; and receiving, by a plurality of flip flop circuits, the plurality of valid signals, in order to generate the plurality of control signals.

15. The signal conversion method of claim 10, wherein the first converter circuitry comprises a multiplying digital to analog converter circuit, the multiplying digital to analog converter circuit is configured to process the first corresponding digital code according to a first clock signal, in order to generate a current stage residue signal, the plurality of flip flop circuits are configured to generate the plurality of control signals according to a second clock signal, and the second clock signal is identical to the first clock signal, or a phase of the second clock signal leads to a phase of the first clock signal.

* * * * *